United States Patent
Kitatani et al.

(10) Patent No.: US 7,329,894 B2
(45) Date of Patent: Feb. 12, 2008

(54) SEMICONDUCTOR LASER DEVICE AND SEMICONDUCTOR OPTICAL MODULATOR

(75) Inventors: Takeshi Kitatani, Hino (JP); Masahiro Aoki, Kokubunji (JP); Tomonobu Tsuchiya, Hachioji (JP)

(73) Assignee: Opnext Japan, Inc., Kanagawa (JP)

( * ) Notice: Subject to any disclaimer, the term of this patent is extended or adjusted under 35 U.S.C. 154(b) by 208 days.

(21) Appl. No.: 11/202,285

(22) Filed: Aug. 12, 2005

(65) Prior Publication Data

US 2006/0237710 A1 Oct. 26, 2006

(30) Foreign Application Priority Data

Apr. 20, 2005 (JP) ............... 2005-122016

(51) Int. Cl.
*H01L 29/02* (2006.01)
*H01L 47/00* (2006.01)

(52) U.S. Cl. .................. 257/2; 257/127; 257/194; 257/195; 257/13; 257/27

(58) Field of Classification Search ............ 257/13–27, 257/194–195
See application file for complete search history.

(56) References Cited

U.S. PATENT DOCUMENTS 5,309,468 A * 5/1994 Makiuchi ............. 372/50.23
2002/0071462 A1* 6/2002 Takemoto et al. ........... 372/43

FOREIGN PATENT DOCUMENTS

| JP | 10-027925 | 4/1997 |
|----|-----------|--------|
| JP | 10027925 A * | 1/1998 |
| JP | 2004-179274 | 11/2002 |
| JP | 2004-319760 | 4/2003 |

OTHER PUBLICATIONS

K. Kurihara et al., "Reduction in the Series Resistance of the Distributed Bragg Reflector in Vertical Cavities by Using Quasi-Graded Superlattices at the Heterointerfaces", J. Appl. Phys., vol. 73, No. 1, (1993), pp. 21-27.

* cited by examiner

*Primary Examiner*—Jerome Jackson
*Assistant Examiner*—Jami M Valentine
(74) *Attorney, Agent, or Firm*—Reed Smith LLP; Stanley P. Fisher, Esq.; Juan Carlos A. Marquez, Esq.

(57) ABSTRACT

Since the semiconductor devices including a stacked structure of group-III-V alloy semiconductor layers different in the kind of group-V constituent atom form the so-called band line-up of type II, band discontinuity in the heterostructure has impeded smooth transport of carriers and deteriorated device characteristics.

According to the present invention, an energy band structure that makes it possible, in one energy band (e.g., a valence band), to smoothly transport carriers of one of two kinds (e.g., holes) by connecting energy discontinuity in an inclined form or stepwise, and at the same, in the other energy band (e.g., a conduction band), to maintain a barrier effect for carriers of the other kind (e.g., electrons) by retaining energy discontinuity, can be realized for improved transport characteristics of carriers at the heterointerface forming the band line-up of type II.

22 Claims, 11 Drawing Sheets

TYPE-I SUPER LATTICE

FIG.2B

TYPE-II SUPER LATTICE

CONVENTIONAL BAND DIAGRAM

FIG.5B

NEW BAND DIAGRAM BY
USING THIS INVENTION

NEW BAND DIAGRAM FOR p-TYPE CONDUCTION LAYER BY USING THIS INVENTION

FIG. 7B

NEW BAND DIAGRAM FOR n-TYPE CONDUCTION LAYER BY USING THIS INVENTION

SEMICONDUCTOR LASER DEVICE AND SEMICONDUCTOR OPTICAL MODULATOR

CLAIM OF PRIORITY

The present application claims priority from Japanese application JP 2005-122016, filed on Apr. 20, 2005, the content of which is hereby incorporated by reference into this application.

BACKGROUND OF THE INVENTION

1. Field of the Invention

The present invention relates to semiconductor optical devices, and more particularly, to a technology for improving the transport characteristics of carriers at heterointerfaces.

2. Description of the Related Art

Recently, the demands for greater transmission capacities are rapidly growing with factors such as the explosive increase in the Internet users. The transmission speeds of Gbps levels, that have traditionally been used for trunk-system optical communications networks, should be necessary after 5-10 years for the networks relatively short in transmission distance such as LAN or MAN. It will be essential that, in addition to the high-speed modulation characteristics mentioned above, the optical modules used for these networks should be supplied at low costs in consideration of use by a large number of users. Therefore, semiconductor lasers which have superior high-temperature lasing characteristics are considered to be suitable for such modules.

Conventional semiconductor lasers, modulators, and other devices for optical communications have fabricated mainly by using GaInAsP on an InP substrate. This quaternary material consists of four kinds of main constituent elements so the design flexibility both in bandgap and in lattice constant is high. In the wavelength compositions of the 1.30-μm and 1.55-μm bands adapted to optical communications, therefore, desired lattice strain can be easily introduced into quantum well active layers, whereby higher device performance has been achieved. However, since the energy difference in the conduction band ($\Delta E_c$) between the quantum well layer and barrier layer of the quantum well in GaInAsP active layers is small, the confinement of electrons is weak and the deterioration of the device characteristics at high temperature is remarkable. For the same physical reason, the active layer has small gain and low relaxation oscillation frequency. From these reasons, the semiconductor lasers that use GaInAsP are probably difficult to satisfy the future demands for speeding-up and cost reduction.

In contrast to this, the use of the AlGaInAs as an active layers on an InP substrate has been intensively investigated by many groups to improve the characteristics of the semiconductor lasers for optical communications in recent years. Compared with the quantum well active layers using GaInAsP, those using AlGaInAs have larger $\Delta E_c$ and can confine electrons effectively even at high temperature. In addition, the gain in active layers using this material is large, so that semiconductor lasers with better high-temperature and high-speed modulation characteristics can be obtained by using this material. Furthermore, it is reported that these physical advantages also bring about the improved extinction characteristics of electro-absorption optical modulators using AlGaInAs.

Figure 1:
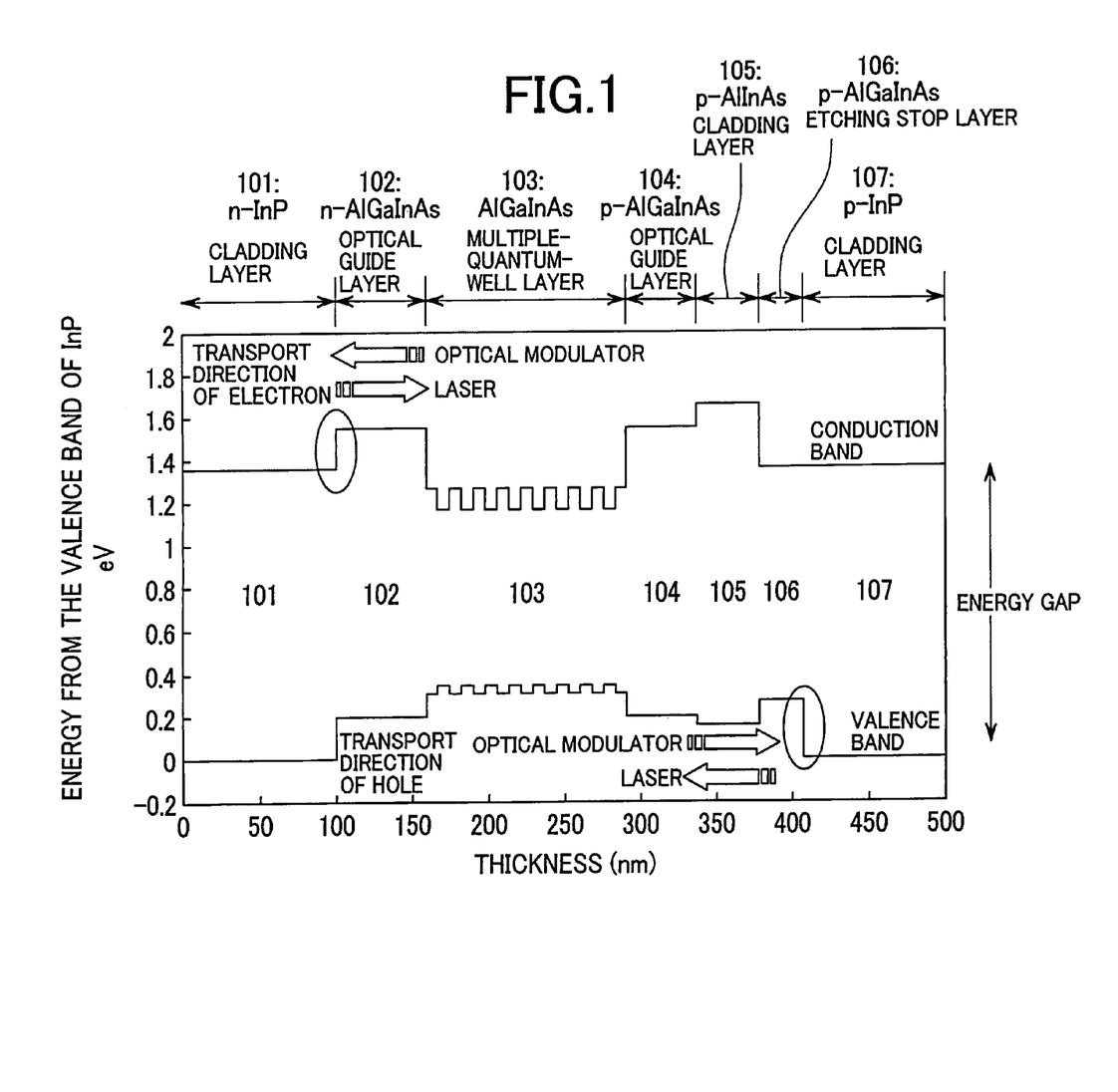
FIG. 1 is an energy band diagram of a typical AlGaInAs-based optical device.

An example of an energy band diagram of typical AlGaInAs-based optical devices is shown in FIG. 1. The upper line in this figure denotes the energy position of a conduction band, and the lower line denotes the energy position of a valence band. The distance between both lines is equivalent to the bandgap in each layers. As can be seen in the figure, for example, InP is used as cladding layers even in AlGaInAs-based optical devices. So semiconductor layers of conventional GaInAsP-based materials are introduced into the appropriate part. Thus, the device designing and manufacturing technologies hitherto accumulated for GaInAsP-based devices have been applied to appropriate part to achieve excellent performance in AlGaInAs-based optical devices.

Another example using a similar technology is a semiconductor laser using GaInNAs as an active layers on a GaAs substrate. GaInNAs, a semiconductor material developed in recent years, can offer the active layers having even larger $\Delta E_c$ than that by using AlGaInAs. Whereas GaInNAs is expected as a very promising material for further improvement of high-speed modulation characteristics of semiconductor lasers, this material has the problem in its crystal quality. The emission efficiency of GaInNAs decreases with N-content. For this reason, in order to obtain better lasing characteristics at a 1.3-μm band, the high In-content and small N-content are adopted in present GaInNAs active layers. As a result, GaInNAs layers with high compressive strain as large as nearly +2% are used as quantum well layers. This large lattice strain is most likely to deteriorate the performance and long-term reliability of the device. An attempt is therefore being studied that a strain compensation structure by applying the GaNPAs (or the like) that has tensile strain as an barrier layers to reduce the average strain of the entire device.

The two examples described above are common in that a stacked structure with one III-V alloy semiconductor layers containing at least As (arsenic) as the group-V element, and another III-V alloy semiconductor layers containing at least atoms different from As, such as N (nitrogen) or P (phosphorus), as the group-V element, is introduced to realize better device characteristics. It goes without saying that this stacked structure with different kind of group-V atom is also applicable to many other types of devices not described here and can contribute to the improvement of device characteristics. In addition, although only optical devices such as semiconductor lasers and optical modulators have been described as examples, these examples do not limit the applicable kinds of optical devices, provided that the stacked structure is applied to many other types of the semiconductor devices.

SUMMARY OF THE INVENTION

The invention herein applied for is intended to achieve better device characteristics by solving problems associated with the semiconductor devices that include a stacked structure with group-III-V alloy semiconductor layers with different kind of group-V atom. More specifically, each such semiconductor device includes, for example, a stacked structure with one III-V alloy semiconductor layers containing at least As (arsenic) as the group-V elements, and another III-V alloy semiconductor layers containing at least atoms different from As, such as N (nitrogen) or P (phosphorus), as the group-V elements.

Based on the energy band diagram of AlGaInAs-based optical devices that is shown in FIG. 1, we consider the transport characteristics of carriers to clarify the problems associated with the conventional devices. FIG. 1 is an energy band diagram assuming a laser and an electro-absorption optical modulator as typical optical devices. In the figure, where the present invention focuses attention on the stacked structure that includes semiconductor layers different in the kind of group-V constituent atom, this structure is introduced into heterointerfaces present between an n-InP cladding layer 101 and an n-AlGaInAs optical guide layer 102 and between a p-AlGaInAs etching stop layer 106 and a p-InP cladding layer 107. In the energy band diagram of these heterointerfaces, a band energy difference occurs in both a conduction band and a valence band, and the conduction band and valence band energy positions of the AlGaInAs layers are both higher than those of the InP layers. This condition is termed the so-called type-II band line-up.

In lasers, electrons are transported from the n-InP cladding layer 101 side through the conduction band and injected into the AlGaInAs multiple-quantum-well active layer 103, while holes are transported from the p-InP cladding layer 107 side through the valence band and injected into the AlGaInAs multiple-quantum-well active layer 103. Injected electrons and holes recombined in the AlGaInAs multiple-quantum-well active layer 103 and generated the light. In electro-absorption optical modulators, conversely to lasers, electrons and holes are generated from the absorbed light in the AlGaInAs multiple-quantum-well active layer 103, then the electrons are transported through the conduction band and taken out from the n-InP cladding layer 101 side, and the holes are transported through the valence band and taken out from p-InP cladding layer 107 side. In this case, since the p-InP cladding layer/AlGaInAs layer heterointerface is a type-II band line-up, the energy difference ($\Delta E_c$) in the conduction band at the interface between the n-InP cladding layer 101 and the n-AlGaInAs optical guide layer 102 impedes the smooth injection of electrons for a laser. Similarly, the energy barrier ($\Delta E_c$) in the conduction band at the interface between the p-AlGaInAs etching stop layer 106 and the p-InP cladding layer 107 becomes an obstacle to taking out of holes for an optical modulator. Since holes, in particular, have larger effective mass compared with electrons, the rate of the carriers which can be transported beyond the energy barrier decrease. The reduction of pile-up of holes in p-AlGaInAs etching stop layer 106, therefore, is a big bottleneck for the improvement of the device characteristics of optical modulators, for example.

In the GaInNAs semiconductor layer previously described as another example, the heterointerface between the GaNPAs barrier layer for strain compensation, and the GaAs optical guide layer, forms also type II band line-up, with different group-V constituent atoms. This heterointerface also impedes the smooth injection of holes and could cause the deterioration of the device characteristics such as an increased threshold current.

Attempts to improve the transport characteristics of carriers by reducing the band energy difference at such a heterointerface have been reported up to the present. One example is by introducing a superlattice layer at the heterointerface. Detail explanation of superlattice layers are described below. Superlattices are created by stacking two different semiconductors, A and B, in alternate plural layers, and are classified into three major types according to the band energy structure at the heterointerface between semiconductors A and B. Of the three types, types I and II closely connected with the present invention are described in detail below.

Figure 2A:
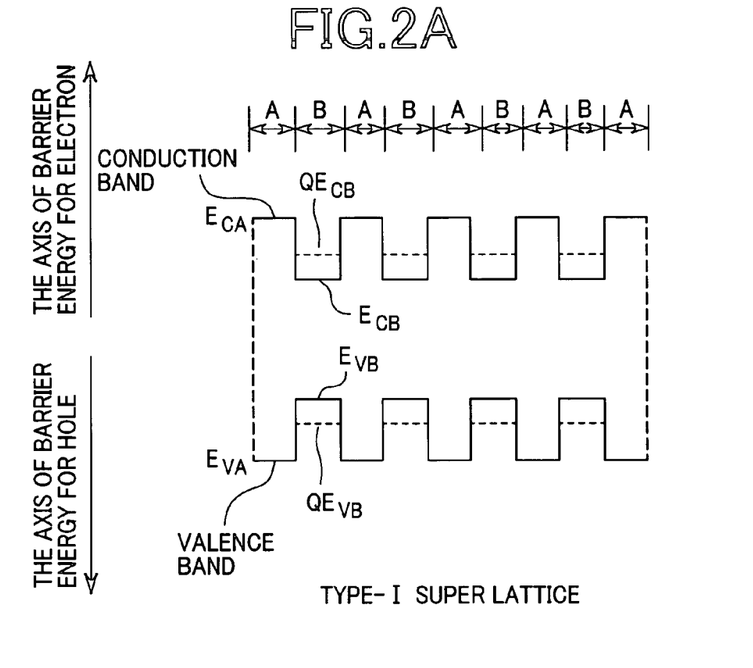
FIGS. 2A and 2B are energy band diagrams of type-I and type-II superlattices, respectively.
Figure 2B:
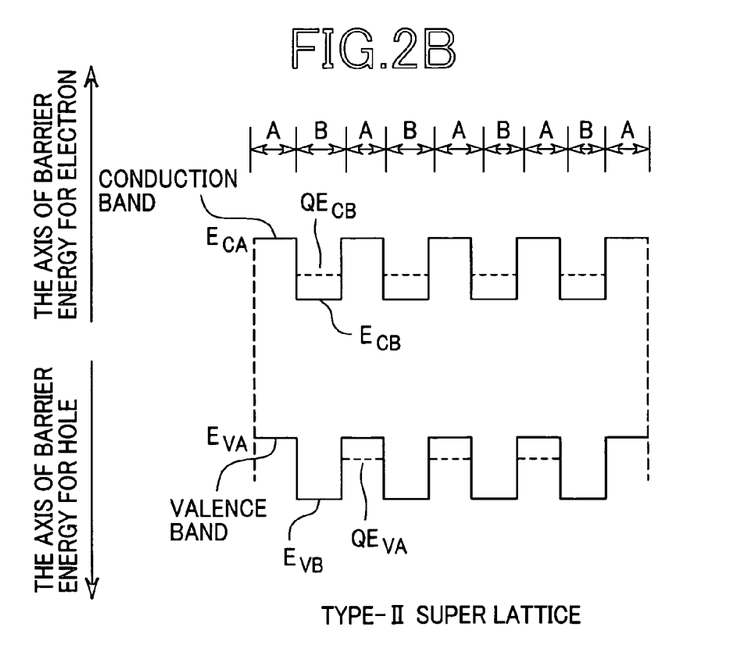

Energy band diagrams of type-I and type-II superlattices are shown in FIGS. 2A and 2B, respectively. The axis that denotes energy barrier for electrons, and the axis that denotes energy barrier for holes are shown together in the figure.

For type-I superlattice of FIG. 2A, when an energy position of a conduction band is viewed as the energy barrier for electrons, an energy position of a conduction band of semiconductor A ($E_{CA}$) is higher than an energy position of a conduction band of semiconductor B ($E_{CB}$) Also, when an energy position of a valence band is viewed as the energy barrier for holes, an energy position of a valence band of semiconductor A ($E_{VA}$) is higher than an energy position of a valence band semiconductor B ($E_{VB}$). When these two semiconductors are stacked alternatetively, therefore, a quantum-well structure with the quantum well layer of semiconductor B in both the conduction band and the valence band will be formed and both electrons and holes will be confined within the quantum well layer. By lowering the thickness of the quantum well layer, the quantum levels in conduction band ($QE_{CB}$) and in valence band ($QE_{VB}$) will be formed at the energy positions (dotted lines in the figure) slightly distant from tops of the conduction band or valence band of semiconductor B, thus permitting the electrons and holes confined within semiconductor B to exist only at specific energy positions. It is one of major features of the type-I superlattice that quantum levels in both the conduction band and valence band are formed in semiconductor B.

For type-II superlattice of FIG. 2B, when an energy position of the conduction band is viewed as the energy barrier for electrons, an energy position of the conduction band of semiconductor A ($E_{CA}$) is higher than the energy position of the conduction band of semiconductor B ($E_{CB}$), similarly to type-I superlattice. However, when an energy position of the conduction band is viewed as the energy barrier for holes, an energy position of the conduction band of semiconductor A ($E_{CA}$) is lower than the energy position of the conduction band of semiconductor B ($E_{CB}$). At this point, type-II superlattice differs from type-I superlattice. This means that the quantum levels in conduction band and in valence band will be formed in different semiconductors. In the examples of the figures, the quantum level ($QE_{CB}$) in the conduction band is formed in semiconductor B and the quantum level ($QE_{VA}$) in the valence band is formed in semiconductor A. Energy positions at which the quantum levels are formed can be artificially controlled by changing the thickness of the quantum well layer.

Figure 3:
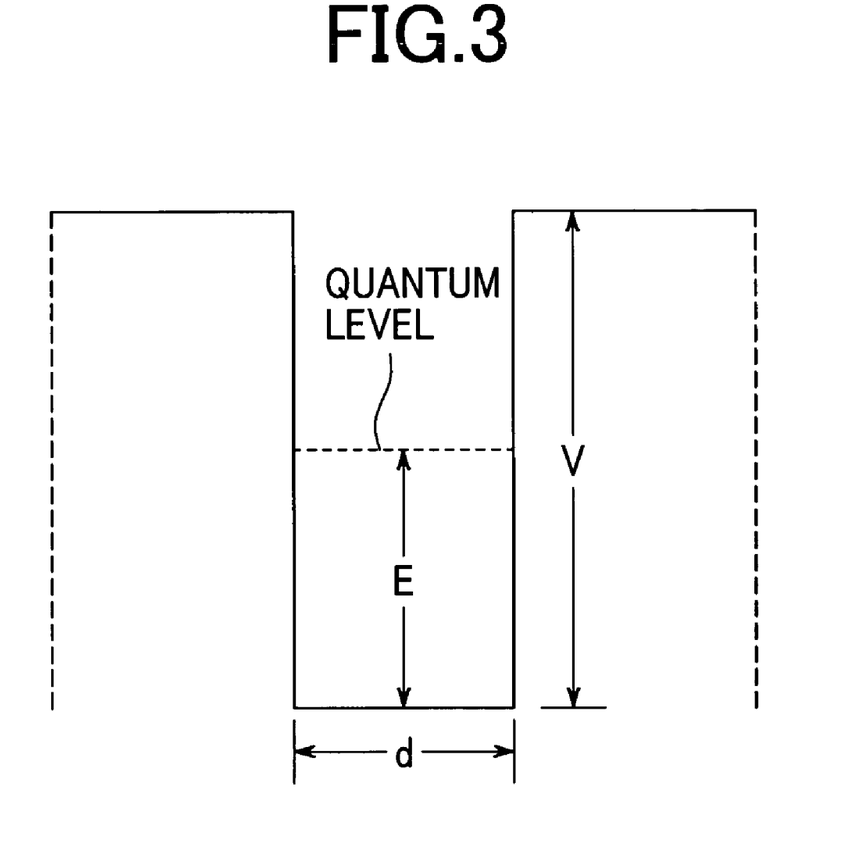
FIG. 3 is a quantum well structural diagram that was used for calculation.
Figure 4:
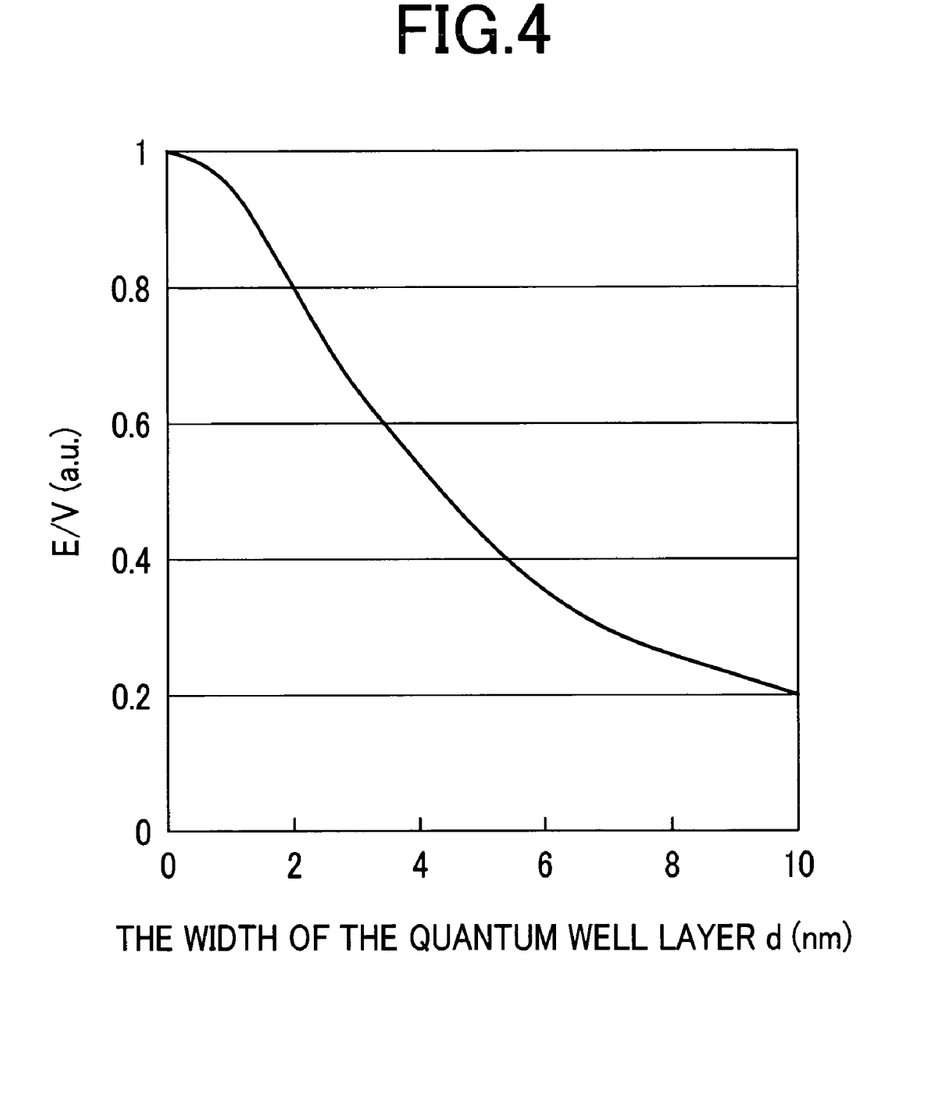
FIG. 4 is a diagram that shows quantum well width dependence of quantum level.

The calculation of the energy position of a quantum level are next shown herein. FIG. 3 is an energy band diagram of the quantum well structure used for the calculation. As shown in this diagram, quantum well width is expressed as "d", a energy height of a barrier layer, as V, and a energy height of a quantum level, as "E". Calculation results of E/V data as a function of "d" are shown in FIG. 4, which indicates that as "d" is increased, E/V gradually decreases. Here, the "d" values shown in this figure are up to 10 nm only. When "d" is too thick to lost quantum size effect, quantum levels no longer form and carriers exist at band edge of the quantum well layer similarly to normal semiconductor layers.

In the example described in the Journal of Applied Physics, Vol. 73, 1993, p. 21, at a GaAs/AlAs type-I heterointerface, a type-I superlattice structure using these materials is introduced to improve the transport characteristics of carriers. The thickness of the GaAs layer in the superlattice decreases gradually from the GaAs layer side toward the AlAs layer side of the heterointerface, whereas the thickness of the AlAs layer in the superlattice gradually increases from the GaAs layer side toward the AlAs layer side of the heterointerface. Thus, the energy values of the quantum levels formed in both the conduction band and valence band of the superlattice can be raised gradually from the GaAs layer, side toward the AlAs layer side, as a result both the conduction band and the valence band can be connected smoothly. When this concept is applied to a heterostructure of type-II heterointerface, same effects can also be obtained by applying a gradual change in thickness similar to the above. Consequently, as denoted by a dotted line near a heterointerface in FIG. 5A, a band energy difference at the heterointerface can be reduced simultaneously in the conduction band and the valence band. This is the way the band connection according to a conventional technology is implemented.

In optical devices as described above, electrons and holes may be simultaneously injected from n-type and p-type layers, respectively, into active layers, or the electrons and the holes may be simultaneously taken out from the active layers to the n-type and p-type layers, respectively. It has already been described that in both cases, the electrons and the holes are always transported in opposite directions.

Figure 5A:
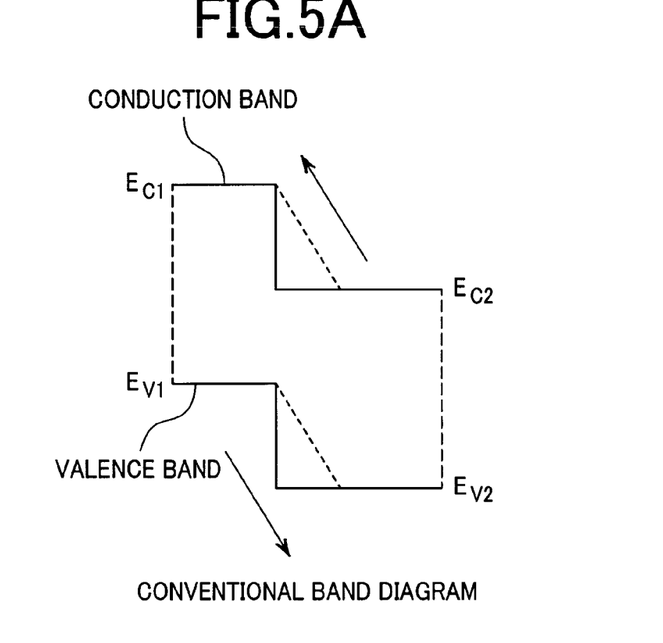
FIGS. 5A and 5B are energy band diagrams based on a conventional technology and on the present invention, respectively.
Figure 5B:
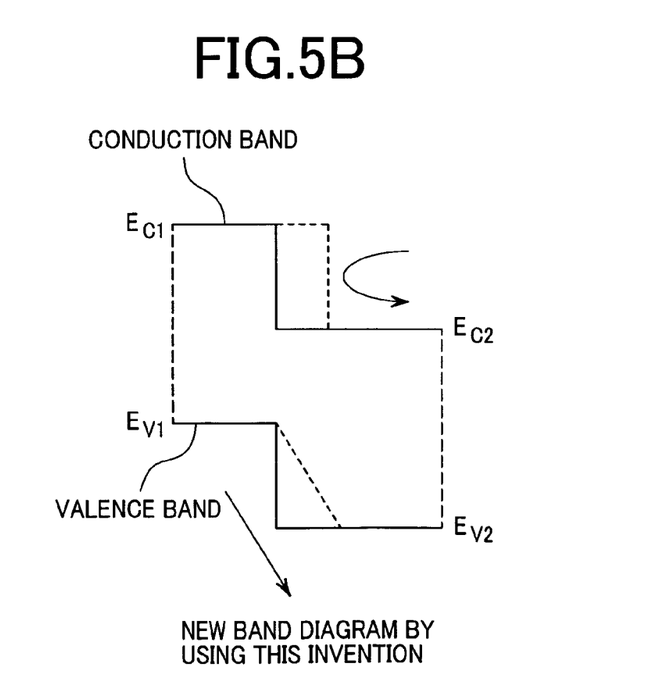

In the conventional technology of FIG. 5A, since the conduction band and the valence band are connected smoothly at the same time, although the transport probability of one kind of carrier (e.g., holes) improves, the possibility of the other kind of carrier (e.g., electrons) leaking out in the same direction is also enhanced at the same time. To solve this problem, the band structure of FIG. 5B is considered to be desirable. That is, carriers of one of two kinds (e.g., holes) are transported smoothly by reducing the band energy difference in one energy band (e.g., valence band) stepwise, and leakage of carriers of the other kind (e.g., electrons) from heterointerfaces is prevented by connecting the other energy band (e.g., conduction band) so as to maintain the discontinuity of the band energy difference. Conventionally, a specific method of achieving such band structure has not been invented.

Figure 6:
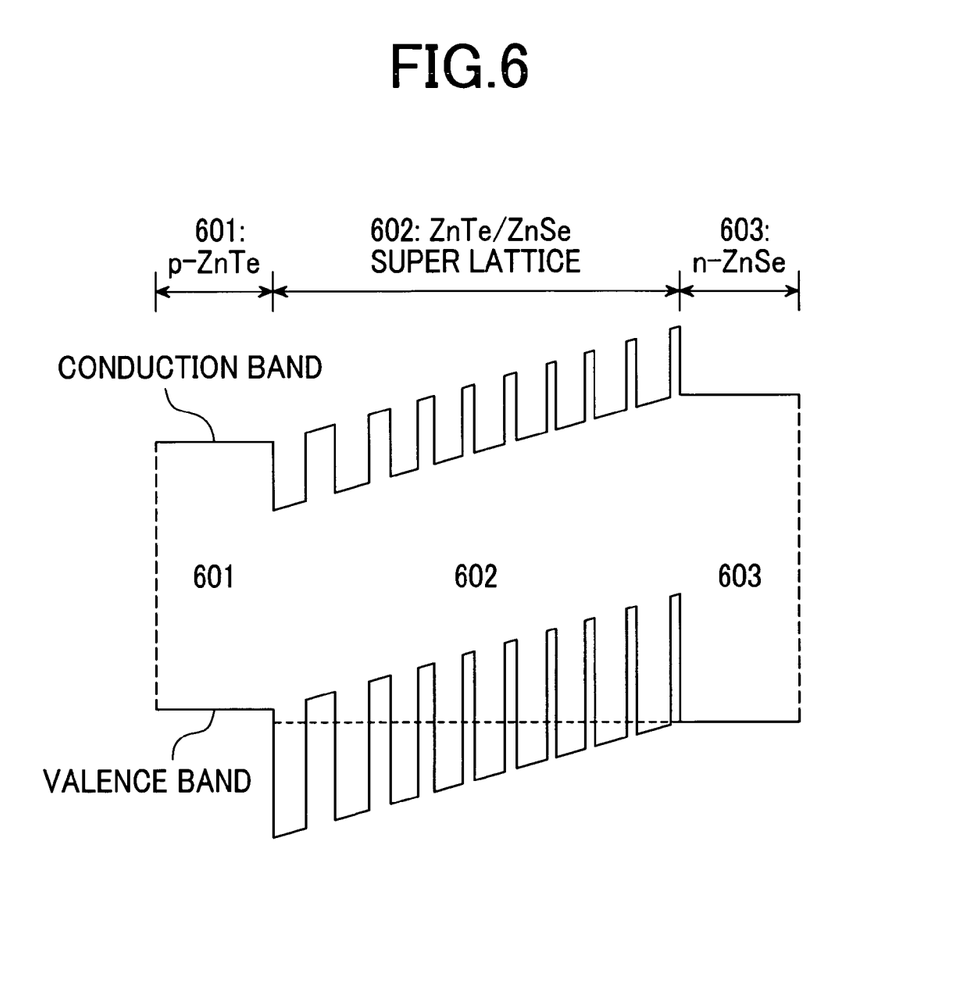
FIG. 6 is an energy band diagram of the device described in Japanese Patent Laid-open No. 10-27925.

Japanese Patent Laid-open No. 10-27925 is described below as yet another example of a conventional technology. An energy band diagram of a device is shown in FIG. 6. This example relates to a structure in which a type-II superlattice 602 made up of ZnTe and ZnSe is introduced between the p-ZnTe 601 and n-ZnSe 603 which are group-II-VI alloy semiconductors. Thicknesses of ZnTe layer in the superlattice is set to 0.3 nm, 0.6 nm, 0.9 nm, 1.2 nm, 1.5 nm, 1.8 nm, 2.4 nm, 3.0 nm, and 5.0 nm, and thicknesses of ZnSe layer in the superlattice are set to a fixed value of 5.0 nm. The quantum level of a valence band gradually increases from the p-ZnTe 601 side toward the n-ZnSe 603 side. Under a forward bias condition, these quantum levels are lined up and this improves the injection efficiency of holes from the p-ZnTe 601 into the n-ZnSe 603. In a conduction band, however, since the thickness of ZnSe layer in superlattice is 5.0 nm, the electrons in the n-ZnSe 603 leak out into the ZnTe/ZnSe superlattice layer 602. This example, therefore, conceptually differs from the new band structure in FIG. 5B that the present inventors invented.

The present inventors made energetic studies to find out a method of achieving a type-II energy band heterostructure that makes it possible, in one energy band (e.g., a valence band), to smoothly transport one carriers of one of two kinds (e.g., holes) by reducing the a bandgap discontinuity stepwise, and at the same, in the other energy band (e.g., a conduction band), to keep a barrier effect for carriers of the other kind (e.g., electrons) by retaining energy discontinuity. The following describes the gist of the present invention:

The present invention is achieved by a semiconductor optical device that comprises: a semiconductor substrate; and a semiconductor multilayer structure formed on the semiconductor substrate; wherein the multilayer structure has at least one set of semiconductor layers including a first semiconductor layer, a second semiconductor layer, and a third semiconductor layer positioned between both the first and second layers; and wherein, in the at least one set of the semiconductor layers, when an energy position of a conduction band is viewed as energy barrier for electrons, an energy position of a conduction band of the first semiconductor layer ($E_{C1}$) is higher than an energy position of a conduction band of the second semiconductor layer ($E_{C2}$), and an energy position at which a quantum level in a conduction band of the third semiconductor layer ($QE_{C3}$) is formed between $E_{C1}$ and $E_{C2}$ and takes a value equal to or greater than 70% and less than 100% of an energy difference between $E_{C1}$ and $E_{C2}$, with $E_{C2}$ as a reference, and when an energy position of a valence band is viewed as energy barrier for holes, an energy position of a valence band of the first semiconductor layer ($E_{V1}$) is lower than an energy position of a valence band of the second semiconductor layer ($E_{V2}$), an energy position at which a quantum level in a valence band of the third semiconductor layer ($QE_{V3}$) is formed is present between $E_{V1}$ and $E_{V2}$, and an energy difference between $E_{V1}$ and $QE_{V3}$ increases stepwise in the direction from the first semiconductor layer, toward the second semiconductor layer, with $E_{V1}$ as a reference.

Alternatively, the present invention is achieved by a semiconductor optical device that comprises: a semiconductor substrate; and a semiconductor multilayer structure formed on the semiconductor substrate; wherein the multilayer structure has at least one set of semiconductor layers including a first semiconductor layer, a second semiconductor layer, and a third semiconductor layer positioned between both the first and second layers; and wherein, in the at least one set of the semiconductor layers, when an energy position of a valence band is viewed as energy barrier for holes, an energy position of a valence band of the first semiconductor layer ($E_{V1}$) is higher than an energy position of a valence band of the second semiconductor layer ($E_{V2}$), and an energy position at which a quantum level in a valence band of the third semiconductor layer ($QE_{V3}$) is formed between $E_{V1}$ and $E_{V2}$ and takes a value equal to or greater than 70% and less than 100% of an energy difference between $E_{V1}$ and $E_{V2}$, with $E_{V2}$ as a reference, and when an energy position of a conduction band is viewed as energy barrier for electrons, an energy position of a conduction band of the first semiconductor layer ($E_{C1}$) is lower than an energy position of a conduction band of the second semiconductor layer ($E_{C2}$), an energy position at which a quantum level in a conduction band of the third semiconductor layer ($QE_{C3}$) is formed between $E_{C1}$ and $E_{C2}$, and an energy difference between $E_{C1}$ and $QE_{C3}$ increases stepwise in the direction from the first semiconductor layer, toward the second semiconductor layer, with $E_{C1}$ as a reference.

Alternatively, the present invention is achieved by a semiconductor optical device that comprises: a semiconductor substrate; and a semiconductor multilayer structure formed on the semiconductor substrate; wherein the multilayer structure includes at least one set of semiconductor layers each including first and second semiconductor layers which form a heterointerface of type-II, and a third semiconductor layer positioned between both the first and second layers; and wherein, in said at least one set of semiconductor layers, the third semiconductor layer is a type-II superlattice layer, a thickness of one kind of semiconductor layer constituting the superlattice layer increases stepwise in the direction from the first semiconductor layer, toward the second semiconductor layer, within a range of from 0.2 to 100 nm, and a thickness of another kind of semiconductor layer constituting the superlattice layer is set to a desired value within a range of from 0.2 nm to 3.0 nm.

A description will be next made of specific logical bases on energy position setting of quantum levels in the conduction band and in the valence band, for realizing an energy band structure of the present invention. As already described herein, the thickness of each layer in the superlattice layer needs to be precisely controlled to set quantum levels at desired energy positions, and related calculation results are already shown in FIG. 4.

The thickness of the layer in the superlattice layer where the energy position of a quantum level is to be increased stepwise can be obtained by gradually reducing the thickness once it has been increased to 100 nm as a maximum allowable sufficient thickness for obtaining a quantum effect. A minimum allowable thickness value at that time is about 0.2 nm, which is equivalent to one atomic layer of thickness. Next, studies were conducted on the thickness of the layer at which the band energy difference is to be kept discontinuous. The probability of carriers being able to exist in a quantum well can be reduced by enhancing E to a value close to V, so that the carriers can be prevented from entering the quantum well. More specifically, E can be enhanced by reducing "d". Formation of such a quantum level at an energy position allows the band energy difference at a semiconductor heterointerface to be kept discontinuous.

It can be seen from the results of FIG. 4 that when "d" is 3.0 nm, E can be raised to an energy value equivalent to about 70% of V. Forming such a quantum level allows the band energy difference at the semiconductor heterointerface to be effectively kept discontinuous. The layer thickness for retaining the band energy difference is therefore defined as any desired value ranging from a minimum allowable value of 0.2 nm equivalent to one atomic layer of thickness, to a maximum allowable value of 3.0 nm. The barrier effect can be maintained, even if the layer thickness slightly fluctuates within this layer thickness range of the superlattice. Although the energy positions of quantum levels more or less change according to the kinds of semiconductor materials constituting the heterointerface, a sufficient barrier effect can be obtained even if the thickness of the quantum well layer is 3.0 nm or less. This layer thickness range is equivalent to the fact that the barrier layer is sufficiently thin at the opposite band where the energy position of the quantum level is to be increased stepwise, and it is possible, by utilizing a tunneling effect, even to improve a transport probability of carriers significantly. These synergetic effects allow carrier transport characteristics to be significantly improved by introducing the superlattice structure of the present invention.

Figure 7A:
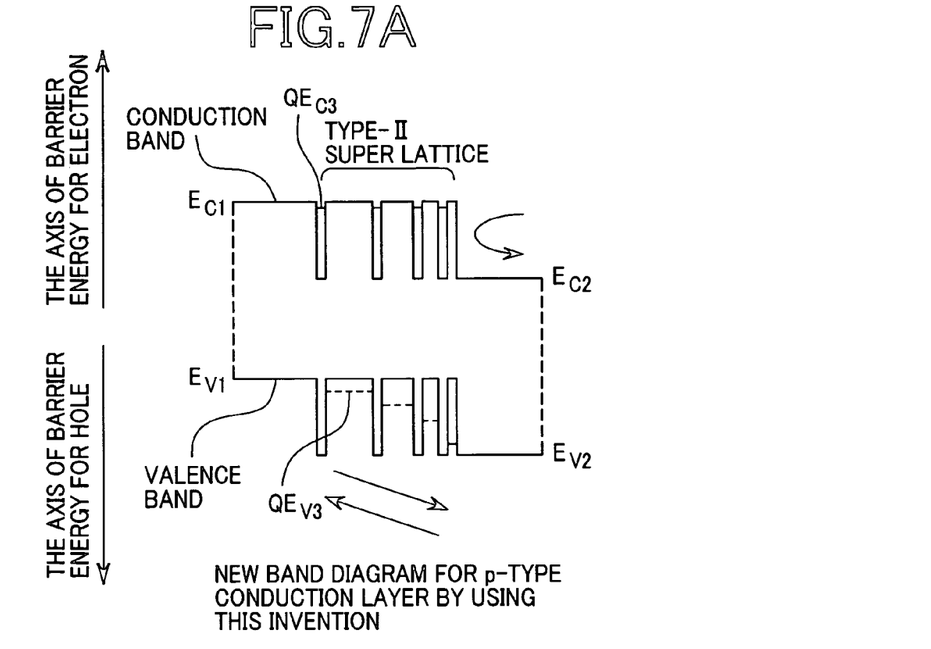
FIGS. 7A and 7B are typical examples of energy band diagrams based the present invention, FIG. 7A showing an example of application to a p-type conduction layer and FIG. 7B showing an example of application to an n-type conduction layer.
Figure 7B:
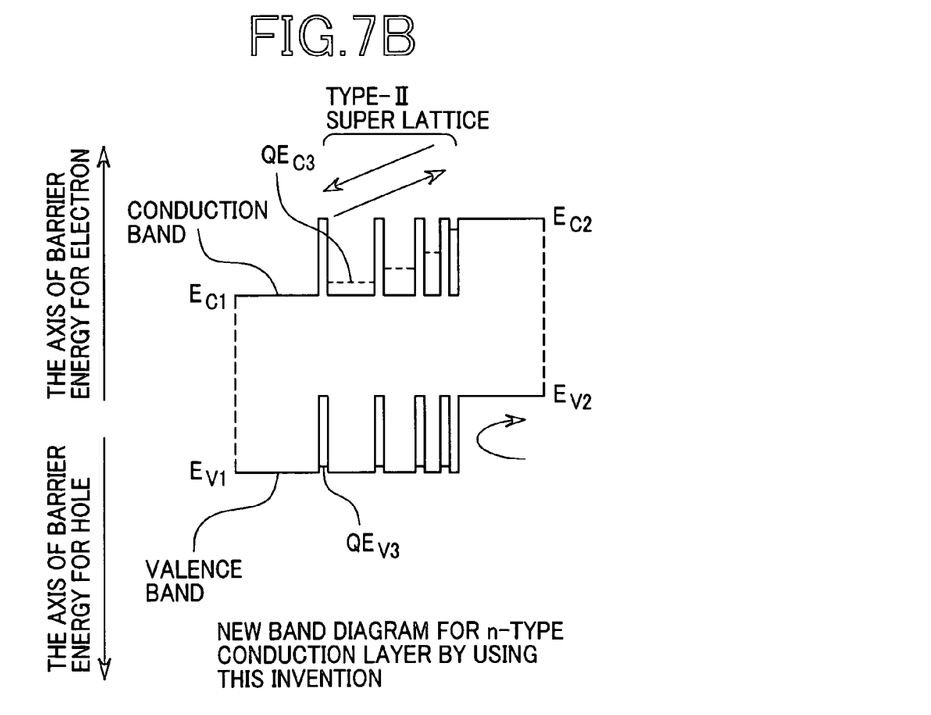

Typical examples of the energy band diagrams of the present invention, realized from the above study results, are shown in FIGS. 7A and 7B. FIG. 7A shows an example of application to a p-type conduction layer. A quantum level ($QE_{V3}$) in a valence band is gradually raised and a band energy difference at a heterointerface is reduced stepwise to improve transport characteristics of holes. At the same time, a quantum level ($QE_{C3}$) in a conduction band is raised to nearly a conduction band position of a barrier layer in order to maintain a barrier effect for electrons. FIG. 7B shows an example of application to an n-type conduction layer. A quantum level ($QE_{C3}$) in a conduction band is gradually raised and a band energy difference at a heterointerface is reduced stepwise to improve transport characteristics of electrons. At the same time, a quantum level ($QE_{V3}$) in a valence band is raised to nearly a valence band position of a barrier layer in order to maintain a barrier effect for holes. If effects equivalent to the above are obtainable, applied positions and structures, or the like, are not limited to those described above, and structural modifications may be conducted to obtain optimal effects.

According to the present invention, it is possible to enhance a confinement effect of carriers within quantum well active layers of a semiconductor laser, thus improving its high-temperature characteristics, and obtaining large gains of the active layers. Thus, a semiconductor laser excellent in high-temperature high-speed modulation characteristics can be realized. A improvement of carrier conversion efficiency and of an extinction characteristics are also expected in an electro-absorption optical modulator and the like.

DETAILED DESCRIPTION OF THE PREFERRED EMBODIMENTS

Prior to description of specific embodiments, a basic concept of the present invention will be described in detail first. According to the present invention, an energy band structure that makes it possible, in one energy band (e.g., a valence band), to smoothly transport carriers of one of two kinds (e.g., holes) by reducing bandgap discontinuity stepwise, and at the same, in the other energy band (e.g., a conduction band), to keep a barrier effect for carriers of the other kind (e.g., electrons) by retaining discontinuity, can be realized for improved transport characteristics of carriers at the heterointerface forming the band line-up of type II. More specifically, the above structure can be achieved by introducing a type-II superlattice layer at the heterointerface, changing a thickness of one of the two semiconductor layers constituting the superlattice layer, stepwise within a range of from 0.2 nm to 100 nm, and setting a thickness of the other semiconductor layer to a desired value within a range of from 0.2 nm to 3.0 nm. Specific embodiments of the present invention will be described below.

First Embodiment

Figure 8:
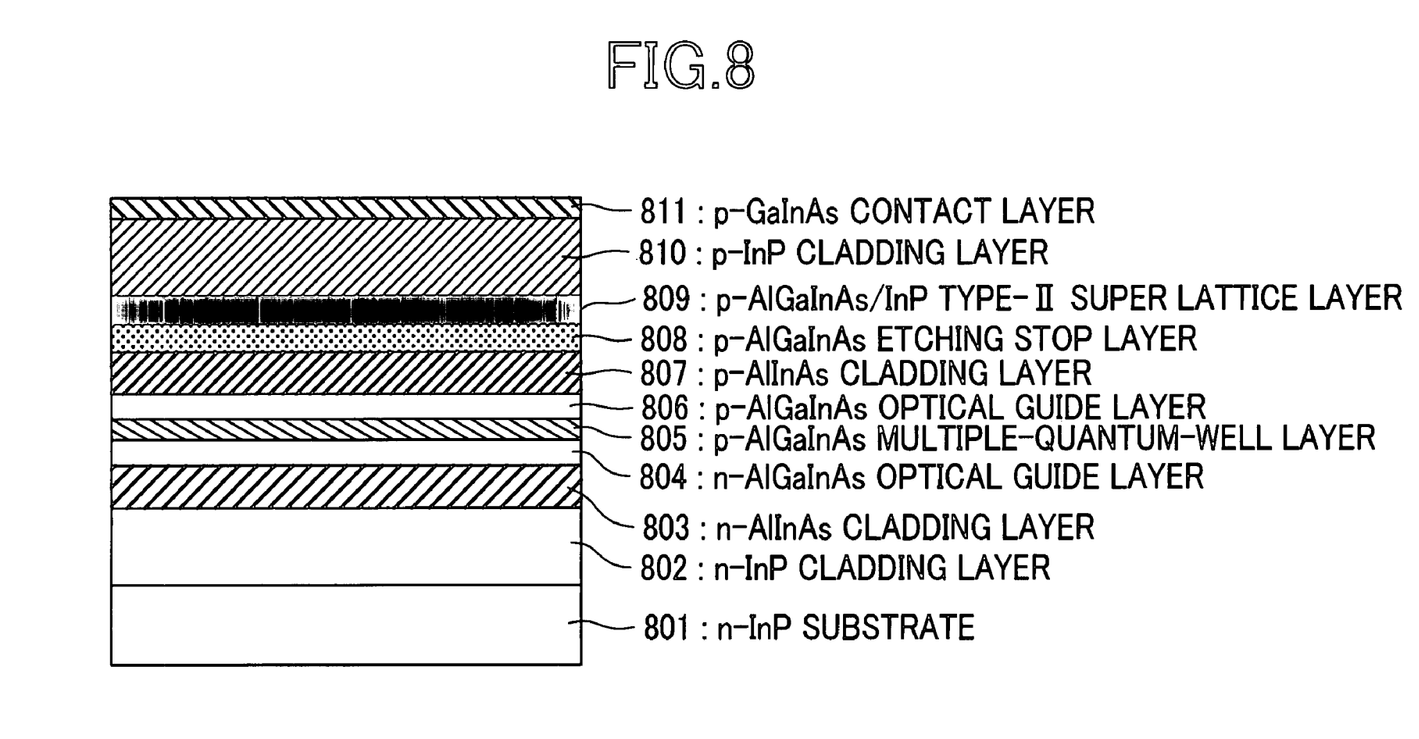
FIG. 8 is a structural view showing in section an AlGaInAs electro-absorption optical modulator according to the present invention.

Manufacture of a low-resistance AlGaInAs electro-absorption optical modulator according to the present invention will be described in detail below as a first embodiment of the invention. A structural view of the device is shown in FIG. 8. This embodiment assumes that metal-organic chemical vapor deposition (MOCVD) is used as a growth method. In this MOCVD method, triethylgallium (TEG), trimethylindium (TMI), and trimethylaluminum (TMAl) are used as supply sources of group-III elements, and arsine ($AsH_3$) and phosphine ($PH_3$) are used as supply sources of group-V elements. Also, disilane ($Si_2H_6$) is used as an n-type doping gas, and dimethylzinc (DMZn), as a p-type doping gas. However, since it is possible to obtain similar effects to the present invention if a structure equivalent to the device structure described herein can be formed, the growth method and the kinds of source materials which can be used are not limited only to those described above.

An n-type InP substrate 801 (n-type doping concentration: $1\times10^{18}$ $cm^{-3}$) is used as a semiconductor substrate to be fabricated. Substrate heating in a $PH_3$ atmosphere is followed by a start of growing a 500-nm-thick n-type InP cladding layer 802 (n-type doping concentration: $1\times10^{18}$ $cm^{-3}$) at a substrate temperature of 600° C. This growing process step is followed by growing a 50-nm-thick n-type AlInAs cladding layer 803 (n-type doping concentration: $1\times10^{18}$ $cm^{-3}$). This growing process step is further followed by forming a 50-nm-thick n-type AlGaInAs optical guide layer 804 (n-type doping concentration: $1\times10^{18}$ $cm^{-3}$), a multiple-quantum-well layer 805 (number of quantum-well layer: 8) including a 7-nm-thick non-doped AlGaInAs barrier layer and a 9-nm-thick non-doped AlGaInAs quantum well layer, and an active layer including a 45-nm-thick p-type AlGaInAs optical guide layer 806 (p-type doping concentration: $1\times10^{17}$ $cm^{-3}$). The formation of these layers is followed by growing a 40-nm-thick p-type AlInAs cladding layer 807 (p-type doping concentration: $1\times10^{18}$ $cm^{-3}$) and a 30-nm-thick p-type AlGaInAs etching stop layer 808 (p-type impurity concentration: $1\times10^{18}$ $cm^{-3}$). This growing process step is followed by forming a p-type AlGaInAs/InP type-II superlattice layer 809 (p-type doping concentration: $1\times10^{18}$ $cm^{-3}$) which is the most important layer in the present invention. The AlGaInAs layer in the superlattice 809 has its thickness set to 10 nm, 5 nm, 3 nm, and 1 nm, in that order, and the InP layer in the superlattice 809 has its thickness maintained at a fixed value of 2 nm. The substrate temperature reaches 700° C. during the growth of n-type InP cladding layer 802, and then is kept at 700° C. during the growth of the layer that contains Al. After that, a part of p-type InP cladding layer 810 (p-type doping concentration: $1\times10^{18}$ $cm^{-3}$) whose thickness is 10 nm is grown, then the growth is stopped and the substrate temperature is reduced from 700° C. to 600° C. After the substrate temperature has stabilized at 600° C., the rest of p-type InP cladding layer 810 (p-type doping concentration: $1\times10^{18}$ $cm^{-3}$) is further grown to a thickness of 1490 nm and then while the growth temperature is being reduced in growth temperature, a 100-nm-thick p-type GaInAs contact layer 811 (p-type doping concentration: $1\times10^{19}$ $cm^{-3}$ is grown to complete the crystal growth process.

After this, a fabrication process of striped-structure and an deposition of electrode are performed to complete the optical modulator as a device. The fabricated device exhibits 10-Gbps modulation characteristics without an outer cooler. Also, the output power under 10-Gbps modulation is as high as +2 dBm.

Figure 9:
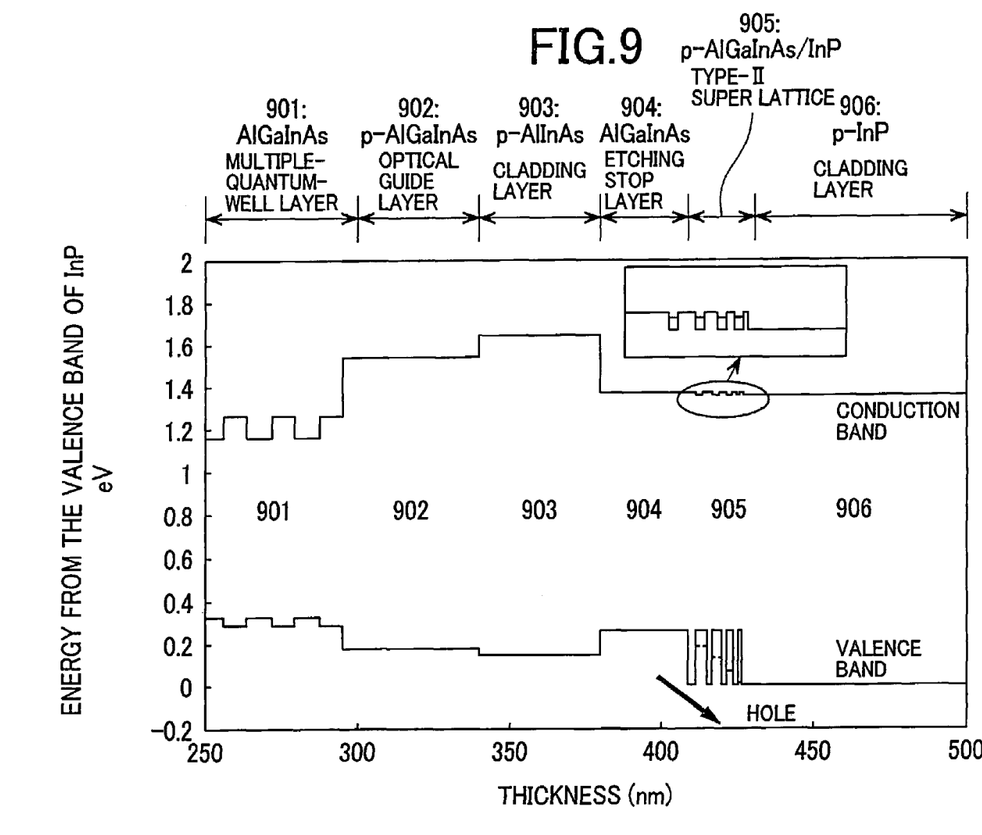
FIG. 9 is an energy band diagram of the neighborhood of a type-II superlattice introduction section in the device of FIG. 8.

The energy band diagram in vicinity of inserted type-II superlattice 905 of this device is shown in FIG. 9. A band energy difference between InGaAlAs 904 and InP 906, in valence band, is reduced stepwise via a quantum level by introduction of the type-II superlattice layer according to the present invention. Thus, pile-up of holes is suppressed significantly. In conduction band, a quantum level is formed at a relative high energy position within the quantum well. In this case, since the band energy difference between InGaAlAs 904 and InP 906 is not so high, although a barrier effect for electrons is small, substantially flat connection of the bands is obtained without hindrance to the band structure between InGaAlAs 904 and InP 906. Therefore, no carrier loss occurs in the superlattice layer, and as a result, modulation characteristics and optical output power are both improved.

Second Embodiment

Figure 10:
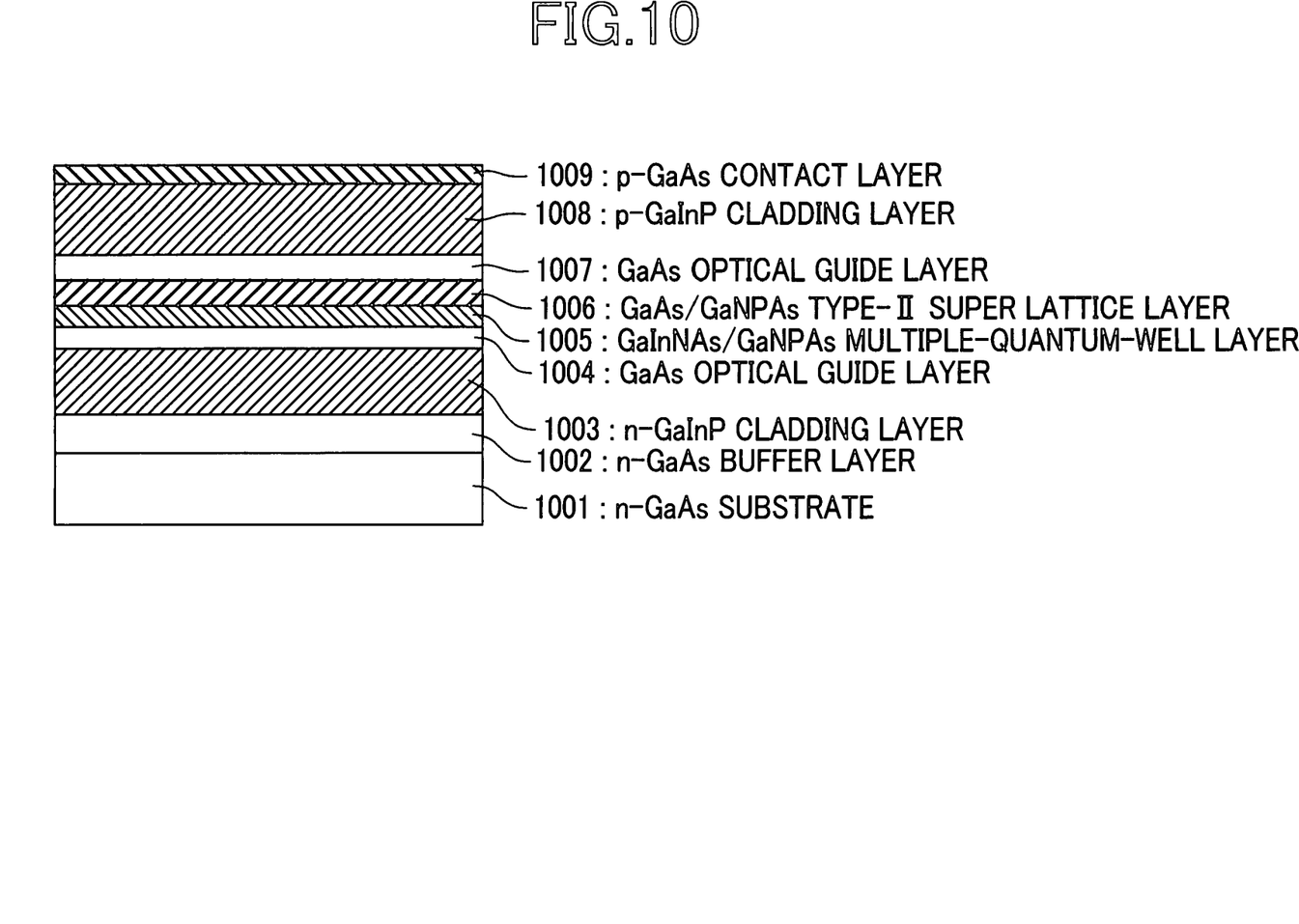
FIG. 10 is a cross-sectional structural view showing a GaInNAs semiconductor laser according to the present invention.

Manufacture of a GaInNAs semiconductor laser according to the present invention will be described in detail below as a second embodiment of the invention. A structural view of the device is shown in FIG. 10. To use GaInNAs as an active layer, it is advantageous to adopt a non-equilibrium growth method during introduction of N, and in addition to the MOCVD method, a molecular beam epitaxial (MBE) method or the like is suitable as such a growth method. This embodiment assumes that gas-source MBE (GS-MBE) is used as the growth method. In the GS-MBE method, gallium (Ga) and indium (In) are used as supply sources of group-III elements, and as supply sources of group-V elements, $AsH_3$ is used for arsenic (As) and $PH_3$ is used for phosphorus (P). Also, silicon (Si) and beryllium (Be) are used as an n-type and a p-type doping material, respectively. If an similar doping concentration is achievable, zinc (Zn) or carbon (C) may be used as an alternative to the above p-type doping material. An N-radical derived by RF plasma excitation of an $N_2$ gas is used for nitrogen (N). Nitrogen plasma excitation can likewise be accomplished by using ECR (Electron Cyclotron Resonance) plasma. However, if a structure equivalent to the device structure described herein can be formed, since similar effects of the present invention are obtainable, the growth method and the kinds of source materials that can be used are not limited only to those described above.

An n-type GaAs substrate 1001 (n-type doping concentration: $2\times10^{18}$ $cm^{-3}$ is used as a semiconductor substrate to be fabricated. Substrate heating in an $AsH_3$ atmosphere is followed by a start of growing a 500-nm-thick n-type GaAs buffer layer 1002 (n-type doping concentration: $1\times10^{18}$ $cm^{-3}$) at a substrate temperature of 600° C. This growing process step is followed by lowering the growth temperature to 500° C. and growing a 1300-nm-thick n-type GaInP cladding layer 1003 (n-type doping concentration: $1\times10^{18}$ $cm^{-3}$). This growing process step is further followed by forming a 50-nm-thick non-doped optical guide layer 1004 and a strain-compensation multiple-quantum-well layer 1005 (number of quantum-well layer: 3) that includes a 10-nm-thick non-doped GaNPAs barrier layer and a 6-nm-thick non-doped GaInNAs quantum well layer. The formation of these layers is followed by forming a non-doped GaAs/GaNPAs type-II superlattice layer 1006 which is the most important layer in the present invention. The GaAs layer in the superlattice 1006 has its thickness set to 2 nm, 5 nm, 7 nm, and 10 nm, in that order, and the GaNPAs layer in the superlattice 1006 has its thickness maintained at a fixed value of 3 nm. Next, a 30-nm-thick non-doped GaAs optical guide layer 1007, a p-type GaInP cladding layer 1008 (p-type doping concentration: $1 \times 10^{18}$ cm$^{-3}$), and a p-type GaAs contact layer (p-type doping concentration: $1 \times 10^{19}$ cm$^{-3}$) are formed to complete crystal growth process steps.

After this, a fabrication process of striped-structure and an deposition of electrode for manufacturing the laser are performed on the thus-grown multi-layer wafer in order to complete the laser as a device. The device that has thus been manufactured lased at a threshold current value of 10 mA and exhibits better laser lasing characteristics at high temperatures up to 85° C. The device also exhibits high-speed modulation characteristics exceeding 10 Gbps. In addition, the device exhibits excellent long-term reliability because of reduced average strain of the entire layer structure.

Figure 11:
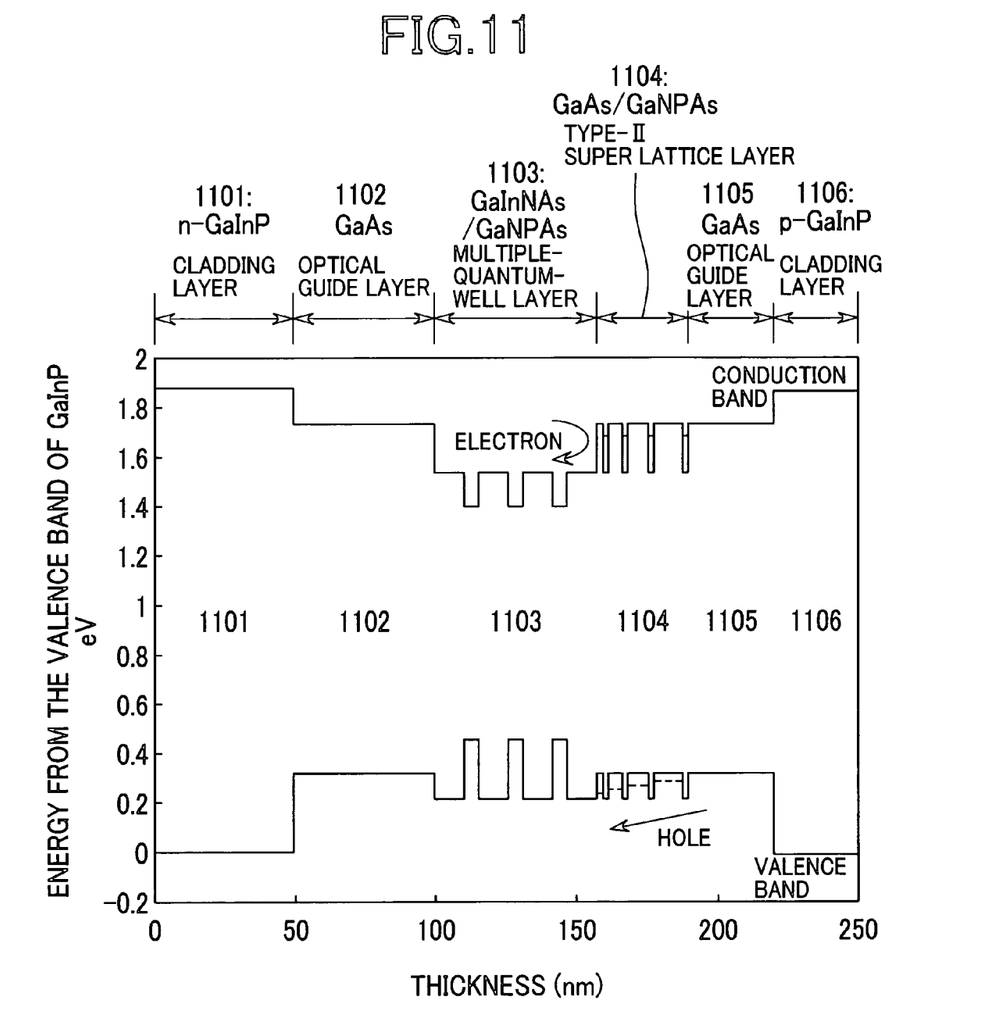
FIG. 11 is an energy band diagram of the neighborhood of a type-II superlattice introduction section in the device of FIG. 10.

The energy band diagram obtained in vicinity of a type-II superlattice introduction section of this device is shown in FIG. 11. A band energy difference of a valence band is reduced stepwise via a quantum level by introduction of type-II superlattice layer 1104 according to the present invention. Holes can thus be injected efficiently into the active layer. In conduction band, a quantum level is formed at a high energy position within the quantum well. A barrier effect for electrons is maintained, and injected electrons are blocked and efficiently confined within the active layer. Superior device characteristics are attained by the effects described above.

As described above, two examples of a device structure which applies the band connection according to the present invention have been presented as embodiments thereof. It goes without saying that the stacked structures according to the present invention will yield equivalent improvement effects when applied to many other types of devices not described herein. In addition, while only an optical modulator and a semiconductor laser have been described assuming only semiconductor optical devices as the types of devices, the types of devices which can be formed are not limited to those types, provided that they are formed by applying the stacked structures described above. Although this is not described herein, these stacked structures are also applicable to alloy-semiconductor-based electronic devices such as high-mobility transistors and heterobipolar transistors. Additionally, the applicable kind of materials are not limited to group-III-V alloy semiconductors, and similar effects are obtainable by the application of the stacked structures even to the heterointerfaces of group-II-V alloy semiconductors or group-VI mixed-crystal semiconductors, for example.

The reference numbers and symbols used in the drawings accompanying the present application are as follows:

101 . . . n-type InP cladding layer, 102 . . . n-type AlGaInAs optical guide layer, 103 . . . AlGaInAs multiple-quantum-well layer, 104 . . . p-type AlGaInAs optical guide layer, 105 . . . p-type AlInAs cladding layer, 106 . . . p-type AlGaInAs etching stop layer, 107 . . . p-type InP cladding layer, 601 . . . p-type ZnTe, 602 . . . ZnTe/ZnSe superlattice layer, 603 . . . n-type ZnSe, 801 . . . n-type InP substrate, 802 . . . n-type InP cladding layer, 803 . . . n-type AlInAs cladding layer, 804 . . . n-type AlGaInAs optical guide layer, 805 . . . AlGaInAs multiple-quantum-well layer, 806 . . . p-type AlGaInAs optical guide layer, 807 . . . p-type AlInAs cladding layer, 808 . . . p-type AlGaInAs etching stop layer, 809 . . . p-type AlGaInAs/InP type-II superlattice layer, 810 . . . p-type InP cladding layer, 811 . . . p-type GaInAs contact layer, 901 . . . AlGaInAs multiple-quantum-well layer, 902 . . . p-type AlGaInAs optical guide layer, 903 . . . p-type AlInAs cladding layer, 904 . . . p-type AlGaInAs etching stop layer, 905 . . . p-type AlGaInAs/InP type-II superlattice layer, 906 . . . p-type InP cladding layer, 1001 . . . n-type GaAs substrate, 1002 . . . n-type GaAs buffer layer, 1003 . . . n-type GaInP cladding layer, 1004 . . . GaAs optical guide layer, 1005 . . . GaInNAs/GaNPAs multiple-quantum-well layer, 1006 . . . GaAs/GaNPAs type-II superlattice layer, 1007 . . . GaAs optical guide layer, 1008 . . . p-type GaInP cladding layer, 1009 . . . p-type GaAs contact layer. 1101 . . . n-type GaInP cladding layer, 1102 . . . GaAs optical guide layer, 1103 . . . GaInNAs/GaNPAs multiple-quantum-well layer, 1104 . . . GaNPAs type-II superlattice layer, 1105 . . . GaAs optical layer, 1106 . . . p-type GaInP cladding layer.

What is claimed is:

1. A semiconductor laser device comprising:
   a semiconductor substrate; and
   a semiconductor multilayer structure formed on the semiconductor substrate,
   wherein the multilayer structure has at least one set of semiconductor layers including a first semiconductor layer, a second semiconductor layer, and a third semiconductor layer positioned midway between both the first and second layers; and
   wherein, in said at least one set of the semiconductor layers, said third semiconductor layer is a Type II superlattice layer that includes first and second kinds of semiconductor layers stacked alternately, the first kind of semiconductor layers having a gradually decreased thickness, and the second of semiconductor layers having an identical thickness;
   when an energy position of a conduction band is viewed as energy barrier for electrons, an energy position of a conduction band of the first semiconductor layer ($E_{C1}$) is higher than an energy position of a conduction band of the second semiconductor layer ($E_{C2}$), and an energy position ($QE_{C3}$) at which a quantum level in a conduction band of the third semiconductor layer is formed between $E_{C1}$ and $E_{C2}$ and takes a value equal to or greater than 70% and less than 100% of an energy difference between $E_{C1}$ and $E_{C2}$, in absence of any voltage applied thereto; and
   when an energy position of a valence band is viewed as energy barrier for holes, an energy position of a valence band of the first semiconductor layer ($E_{V1}$) is lower than an energy position of a valence band of the second semiconductor layer ($E_{V2}$), energy positions ($QE_{V3}$) at which quantum levels in a valence band of the third semiconductor layer are formed between $E_{V1}$ and $E_{V2}$, such that an energy difference between $E_{V1}$ and $QE_{V3}$ increases stepwise in the direction from the first semiconductor layer toward the second semiconductor layer in absence of any voltage applied thereto.

2. The semiconductor laser device according to claim 1, further comprising an active layer which generates light, a cladding layer adapted to confine the generated light, and a cavity for obtaining laser light from the generated light.

3. The semiconductor laser device according to claim 2, wherein the first, second, and third semiconductor layers are each selected from group-III-V alloy semiconductors which have at least one kind of group-III atom of the group consisting of Al, Ga, In, B, and Tl, and at least one kind of group-V atom of the group consisting of N, P, As, Sb, and Bi.

4. The semiconductor laser device according to claim 2, wherein the first, second, and third semiconductor layers are each selected from the group consisting of AlAs, GaAs, InAs, AlP, GaP, InP, AlGaAs, GaInAs, AlGaInAs, GaAsP, GaInP, GaInAsP, GaInNAs, GaNAs, InNAs, and GaNPAs.

5. A semiconductor optical modulator device comprising:
a semiconductor substrate; and
a semiconductor multilayer structure formed on the semiconductor substrate;
wherein the multilayer structure has at least one set of semiconductor layers including a first semiconductor layer, a second semiconductor layer, and a third semiconductor layer positioned midway between both the first and second layers; and
wherein, in said at least one set of the semiconductor layers, said third semiconductor layer is a Type II superlattice layer that includes first and second kinds of semiconductor layers stacked alternately, the first kind of semiconductor layers having a gradually decreased thickness, and the second of semiconductor layers having an identical thickness;
when an energy position of a conduction band is viewed as energy barrier for electrons, an energy position of a conduction band of the first semiconductor layer ($E_{C1}$) is higher than an energy position of a conduction band of the second semiconductor layer ($E_{C2}$), and an energy position at which a quantum level in a conduction band of the third semiconductor layer is formed between $E_{C1}$ and $E_{C2}$ and takes a value equal to or greater than 70% and less than 100% of an energy difference between $E_{C1}$ and $E_{C2}$, in absence of any voltage applied thereto; and
when an energy position of a valence band is viewed as energy barrier for holes, an energy position of a valence band of the first semiconductor layer ($E_{V1}$) is lower than an energy position of a valence band of the second semiconductor layer ($E_{V2}$), energy positions ($QE_{V3}$) at which quantum levels in a valence band of the third semiconductor layer are formed between $E_{V1}$ and $E_{V2}$, such that an energy difference between $E_{V1}$ and $QE_{V3}$ increases stepwise in the direction from the first semiconductor layer toward the second semiconductor layer, in absence of any voltage applied thereto.

6. The semiconductor optical modulator device according to claim 5, further comprising an absorption layer which absorbs light, and a cladding layer adapted to confine light, the absorbed light being converted into electric currents.

7. The semiconductor optical modulator device according to claim 6, wherein the first, second, and third semiconductor layers are each selected from group-III-V alloy semiconductors which have at least one kind of group-III atom of the group consisting of Al, Ga, In, B, and Tl, and at least one kind of group-V atom of the group consisting of N, P, As, Sb, and Bi.

8. The semiconductor optical modulator device according to claim 6, wherein the first, second, and third semiconductor layers are each selected from the group consisting of AlAs, GaAs, InAs, AlP, GaP, InP, AlGaAs, GaInAs, AlGaInAs, GaAsP, GaInP, GaInAsP, GaInNAs, GaNAs, InNAs, and GaNPAs.

9. A semiconductor optical laser device comprising:
a semiconductor substrate; and
a semiconductor multilayer structure formed on the semiconductor substrate,
wherein the multilayer structure has at least one set of semiconductor layers including a first semiconductor layer, a second semiconductor layer, and a third semiconductor layer positioned between both the first and second layers; and
wherein, in said at least one set of the semiconductor layers, said third semiconductor layer is a Type II superlattice layer that includes first and second kinds of semiconductor layers stacked alternately, and in absence of any voltage applied thereto, the first kind of semiconductor layers having a gradually decreased thickness, and the second of semiconductor layers having an identical thickness;
when an energy position of a valence band is viewed as energy barrier for holes, an energy position of a valence band of the first semiconductor layer ($E_{V1}$) is higher than an energy position of a valence band of the second semiconductor layer ($E_{V2}$), and an energy position at which a quantum level ($QE_{V3}$) in a valence band of the third semiconductor layer is formed between $E_{V1}$ and $E_{V2}$ and takes a value equal to or greater than 70% and less than 100% of an energy difference between $E_{V1}$ and $E_{V2}$, in absence of any voltage applied thereto; and
when an energy position of a conduction band is viewed as energy barrier for electrons, an energy position of a conduction band of the first semiconductor layer ($E_{C1}$) is lower than an energy position of a conduction band of the second semiconductor layer ($E_{C2}$), energy positions at which quantum levels ($QE_{C3}$) in a conduction band of the third semiconductor layer are formed between $E_{C1}$ and $E_{C2}$, such that an energy difference between $E_{C1}$ and $QE_{C3}$ increases stepwise in the direction from the first semiconductor layer toward the second semiconductor layer, in absence of any voltage applied thereto.

10. The semiconductor laser device according to claim 9, further comprising an active layer which generates light, a cladding layer adapted to confine the generated light, and a cavity for obtaining laser light from the generated light.

11. A semiconductor optical modulator device comprising:
a semiconductor substrate; and
a semiconductor multilayer structure formed on the semiconductor substrate,
wherein the multilayer structure has at least one set of semiconductor layers including a first semiconductor layer, a second semiconductor layer, and a third semiconductor layer positioned between both the first and second layers; and
wherein, in said at least one set of the semiconductor layers, said third semiconductor layer is a Type II superlattice layer that includes first and second kinds of semiconductor layers stacked alternately, and in absence of any voltage applied thereto, the first kind of semiconductor layers having a gradually decreased thickness, and the second of semiconductor layers having an identical thickness;
when an energy position of a valence band is viewed as energy barrier for holes, an energy position of a valence band of the first semiconductor layer ($E_{V1}$) is higher than an energy position of a valence band of the second semiconductor layer ($E_{V2}$), and an energy position at which a quantum level ($QE_{V3}$) in a valence band of the third semiconductor layer is formed between $E_{V1}$ and $E_{V2}$ and takes a value equal to or greater than 70% and less than 100% of an energy difference between $E_{V1}$ and $E_{V2}$, in absence of any voltage applied thereto; and when an energy position of a conduction band is viewed as energy barrier for electrons, an energy position of a conduction band of the first semiconductor layer ($E_{C1}$) is lower than an energy position of a conduction band of the second semiconductor layer ($E_{C2}$), energy positions at which quantum levels ($QE_{C3}$) in a conduction band of the third semiconductor layer are formed between $E_{C1}$ and $E_{C2}$, such that an energy difference between $E_{C1}$ and $QE_{C3}$ increases stepwise in the direction from the first semiconductor layer toward the second semiconductor layer, in absence of any voltage applied thereto.

12. The semiconductor optical modulator device according to claim 11, further comprising an absorption layer which absorbs light, and a cladding layer adapted to confine light, and the absorbed light being converted into electric currents.

13. The semiconductor optical modulator device according to claim 12, wherein the first, second, and third semiconductor layers are each selected from group-III-V alloy semiconductors which have at least one kind of group-III atom of the group consisting of Al, Ga, In, B, and Tl, and at least one kind of group-V atom of the group consisting of N, P, As, Sb, and Bi.

14. The semiconductor optical modulator device according to claim 12, wherein the first, second, and third semiconductor layers are each selected from the group consisting of AlAs, GaAs, InAs, AlP, GaP, InP, AlGaAs, GaInAs, AlGaInAs, GaAsP, GaInP, GaInAsP, GaInNAs, GaNAs, InNAs, and GaNPAs.

15. A semiconductor laser device comprising:
   a semiconductor substrate; and
   a semiconductor multilayer structure formed on the semiconductor substrate,
   wherein the multilayer structure includes at least one set of semiconductor layers each including first and second semiconductor layers which form a heterointerface of type II, and a third semiconductor layer positioned midway between both the first and second layers; and
   wherein, in said at least one set of semiconductor layers, the third semiconductor layer is a type-II superlattice layer that includes two kinds of semiconductor layers stacked alternately, thicknesses of one kind of the semiconductor layers constituting the superlattice layer increase stepwise in the direction from the first semiconductor layer, toward the second semiconductor layer, within a range of from 0.2 to 100 nm, and an uniform thickness of another kind of the semiconductor layers constituting the superlattice layer is set to a constant value within a range of from 0.2 nm to 3.0 nm.

16. The semiconductor laser device according to claim 15, further comprising an active layer which generates light, a cladding layer adapted to confine the generated light, and a cavity for obtaining laser light from the generated light.

17. The semiconductor laser device according to claim 16, wherein the first, second, and third semiconductor layers are each selected from group-III-V alloy semiconductors which have at least one kind of group-III atom of the group consisting of Al, Ga, In, B, and Tl, and at least one kind of group-V atom of the group consisting of N, P, As, Sb, and Bi.

18. The semiconductor laser device according to claim 16, wherein the first, second, and third semiconductor layers are each selected from the group consisting of AlAs, GaAs, InAs, AlP, GaP, InP, AlGaAs, GaInAs, AlGaInAs, GaAsP, GaInP, GaInAsP, GaInNAs, GaNAs, InNAs, and GaNPAs.

19. A semiconductor optical modulator device comprising:
   a semiconductor substrate; and
   a semiconductor multilayer structure formed on the semiconductor substrate, wherein the multilayer structure includes at least one set of semiconductor layers each including first and second semiconductor layers which form a heterointerface of type II, and a third semiconductor layer positioned midway between both the first and second layers; and
   wherein, in said at least one set of semiconductor layers, the third semiconductor layer is a type-II superlattice layer that includes two kinds of semiconductor layers stacked alternately, thicknesses of one kind of the semiconductor layers constituting the superlattice layer increase stepwise in the direction from the first semiconductor layer, toward the second semiconductor layer, within a range of from 0.2 to 100 mn, and an uniform thickness of another kind of the semiconductor layers constituting the superlattice layer is set to a constant value within a range of from 0.2 nm to 3.0 nm.

20. The semiconductor optical modulator device according to claim 19, further comprising an absorption layer which absorbs light, and a cladding layer adapted to confine light, the absorbed light being converted into electric currents.

21. The semiconductor optical modulator device according to claim 20, wherein the first, second, and third semiconductor layers are each selected from group-III-V alloy semiconductors which have at least one kind of group-III atom of the group consisting of Al, Ga, In, B, and Tl, and at least one kind of group-V atom of the group consisting of N, P, As, Sb, and Bi.

22. The semiconductor optical modulator device according to claim 20, wherein the first, second, and third semiconductor layers are each selected from the group consisting of AlAs, GaAs, InAs, AlP, GaP, InP, AlGaAs, GaInAs, AlGaInAs, GaAsP, GaInP, GaInAsP, GaInNAs, GaNAs, InNAs, and GaNPAs.

* * * * *